United States Patent
Chang et al.

[11] Patent Number: 6,140,246
[45] Date of Patent: *Oct. 31, 2000

[54] IN-SITU P DOPED AMORPHOUS SILICON BY NH3 TO FORM OXIDATION RESISTANT AND FINER GRAIN FLOATING GATES

[75] Inventors: Kent Kuohua Chang, Cupertino; Ken Au, Fremont; John Jianshi Wang, San Jose, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/993,444

[22] Filed: Dec. 18, 1997

[51] Int. Cl.$^7$ .................................................. H01L 21/302
[52] U.S. Cl. ........................ 438/706; 438/714; 438/743
[58] Field of Search .................................. 438/706, 714, 438/743, 262, 264, 257

[56] References Cited

U.S. PATENT DOCUMENTS

| | | | |
|---|---|---|---|
| 5,342,801 | 8/1994 | Perry et al. | 437/52 |
| 5,427,967 | 6/1995 | Sadjadi et al. | 437/43 |
| 5,427,970 | 6/1995 | Hsue et al. | 438/262 |
| 5,681,770 | 10/1997 | Ogura et al. | 438/262 |
| 5,789,295 | 8/1998 | Liu | 438/264 |
| 5,824,582 | 10/1998 | Tseng | 438/254 |
| 5,840,607 | 11/1998 | Yeh et al. | 438/257 |

OTHER PUBLICATIONS

U.S. Patent Application, Serial No. 08/993,443; Filed: Dec. 18, 1997; Entitled: Nitrogen Ion Implanted Amorphous Silicon to Produce Oxidation Resistant And Finer Grain Polysilicon Based Floating Gates; Inventors: Kent K. Chang, et al.; attorney docket No. M-5386 US.

Primary Examiner—Benjamin L. Utech
Assistant Examiner—Kin-Chan Chen
Attorney, Agent, or Firm—Skjerven, Morrill, MacPherson, Franklin & Friel LLP; Edward C. Kwok

[57] ABSTRACT

A polysilicon-based floating gate is formed so as to be resistant to oxidation that occurs during multiple thermocycles in fabrication. Accordingly, edge erase times in NOR-type memory devices may be minimized. Additionally, manufacture of oxidation resistant floating gates reduces variations in edge erase times among multiple NOR-type memory devices. A layer of amorphous silicon is deposited on a silicon substrate by directing silane, a phosphene and helium gas mixture, and ammonia at the surface of the silicon substrate thereby doping the amorphous silicon in situ. The amorphous silicon layer is then etched so as to overlap slightly with regions that will later correspond to the source and drain regions. Next, a lower oxide layer of an ONO dielectric is deposited and the device is heated. A thermo-cycle is eliminated by heating the amorphous silicon during formation of the oxide layer rather than immediately following its deposition. Later, the nitride and oxide layers of the ONO dielectric, a second polysilicon layer, a tungsten silicide layer, and SiON layers are successively formed.

22 Claims, 2 Drawing Sheets

6,140,246

IN-SITU P DOPED AMORPHOUS SILICON BY NH3 TO FORM OXIDATION RESISTANT AND FINER GRAIN FLOATING GATES

BACKGROUND OF THE INVENTION

1. Field of the Invention

This invention relates to memory cells and methods for manufacture thereof. Specifically, the present invention relates to a method for manufacturing memory cells while providing an oxidation resistant floating gate structure.

2. Discussion of Related Art

FIG. 1 shows a cross sectional view of a core cell in a NOR-type memory device. As shown in FIG. 1, channel 2 and source 4 and drain 6 regions are present in an active region of silicon substrate 8. Also present are a tunnel oxide layer 10, floating gate 12, oxide-nitride-oxide ("ONO") 14 dielectric, control gate 16, tungsten silicide layer 18, polysilicon cap 19, and silicon oxynitride (SiON) layer 20.

To program the NOR-type memory device, positive voltages are applied to drain 6 and floating gate 12 that force electrons to inject from the substrate near drain 6 to floating gate 12. To erase the NOR-type memory device, a negative voltage is applied to the floating gate 12 and positive voltage is applied to source 4 that forces electrons to tunnel to the source region. The more overlap that exists between source 4 and floating gate 12, the faster the erase step.

In order to manufacture a NOR-type memory device, a layer of amorphous silicon is deposited over an oxide coated silicon substrate and then heated (a so called "thermo-cycle") (hereinafter "alternative heating step") to form polysilicon. The polysilicon is next patterned to form an intermediate version of floating gate 12 of FIG. 1. The patterned polysilicon has some overlap with desired source region 60 and desired drain region 62, which correspond, prior to doping, to source 4 and drain 6 regions of FIG. 1, respectively. Subsequently, a triple layer consisting of oxide-nitride-oxide ("ONO") and second layer of polysilicon are provided. Formation of the ONO and a second layer of polysilicon involve heating the device to temperatures above 500 degrees Celsius. Later, the device is annealed at a temperature of approximately 900 degrees Celsius to complete the transformation of patterned polysilicon to floating gate 12. As a consequence of multiple thermo-cycles, the floating gate diminishes due to oxidation. FIG. 2 depicts, for example, that in a completed NOR-type memory core cell, the overlap between portions of oxidized floating gate 30 that contact the surface directly above source 4 and drain 6 regions (hereinafter "floating gate overlap") diminish. The edges of the oxidized floating gate 30 round at positions 32 due to oxidation. The electric field between the edge of the oxidized floating gate 30 and the source 4 region lowers as a result. Consequently, the duration of an erase operation in the NOR-type memory device (hereinafter "edge erase time") increases.

Floating gates vary in sizes among cells. One reason for the variation is that the level of floating gate diminution caused by oxidation varies among cells. In applications where NOR-type memory devices operate in parallel, edge erase times of the devices must be comparable. Therefore, techniques are necessary that minimize variations in edge erase times.

SUMMARY OF THE INVENTION

The present invention reduces the amount of oxidation of a polysilicon-based floating gate that occurs when a semiconductor device is subject to multiple thermo-cycles during fabrication. The polysilicon floating gate is manufactured so as to be resistant but not impervious to thermo-cycle oxidation. Consequently, manufacture of oxidation resistant floating gates serves to reduce edge erase times in NOR-type memory devices. Additionally, manufacture of oxidation resistant floating gates reduces variations in edge erase times among multiple NOR-type memory devices.

The resulting top and bottom of the floating gate are smooth and have small and uniform grain sizes. The smooth top surface of the floating gate improves the reliability of the ONO dielectric The smooth bottom with fine uniform grains reduces variations in edge erase times among multiple NOR-type memory devices.

A layer of amorphous silicon is deposited over an oxide coated silicon substrate by directing a mixture of silane, a phosphene-helium mixture, and ammonia at the surface of the oxide coated silicon substrate thereby doping the amorphous silicon in situ. The amorphous layer is then etched so as to overlap slightly with regions that will later correspond to the source and drain regions. The etched amorphous silicon layer corresponds to an intermediate form of a floating gate. Next, a lower oxide layer of an ONO dielectric is deposited and the device is heated. The heating step serves to begin transformation of the amorphous silicon to polysilicon. A thermo-cycle is eliminated by heating the amorphous silicon during formation of the oxide layer rather than immediately following its deposition. Elimination of a thermo-cycle reduces the total level of oxidation of the floating gate.

The present invention is better understood upon consideration of the detailed description below, in conjunction with the accompanying drawings.

DETAILED DESCRIPTION OF THE PREFERRED EMBODIMENTS

Figure 3:
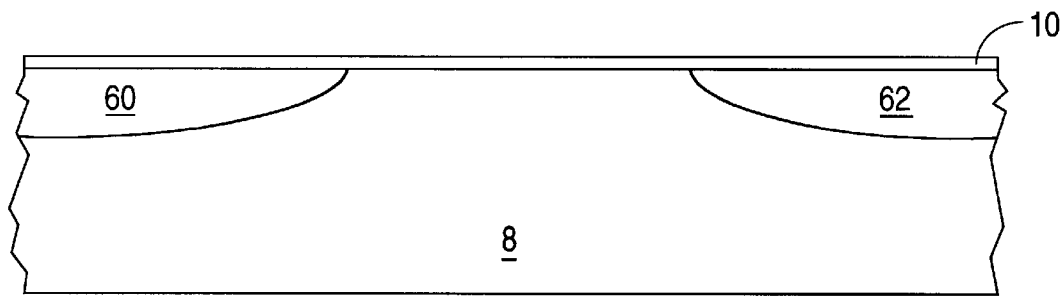
FIG. 3 depicts a cross sectional view of a portion of a NOR-type memory core cell including an active region of silicon substrate 8 and desired source region 60 and desired drain region 62.

One embodiment of the present invention is a NOR-type memory core cell formed of an active region of a silicon substrate 8 having a desired source region 60 and desired drain region 62, as shown in FIG. 3. In this embodiment, a tunnel oxide layer 10 is formed to 95 angstroms in thickness.

A layer of amorphous silicon 34 is deposited over tunnel oxide layer 10 using a chemical vapor deposition (CVD)

process. The CVD process involves directing a mixture of silane gas ($SiH_4$) and a phosphene ($PH_3$) and helium gas mixture towards tunnel oxide layer 10 in an environment with a temperature between 510–530 degrees Celsius. The flow rates of silane gas and the phosphene-helium gas mixture are 2000 sccm and 22 sccm, respectively. In the phosphene and helium gas mixture, phosphene is provided at approximately one percent of the mixture. In this embodiment, the desired doping level in the amorphous silicon is between $1\times10^{19}$ atoms/cm$^3$ and $5\times10^{19}$ atoms/cm$^3$.

Next, nitrogen ions are implanted into the amorphous silicon such that a concentration of $1\times10^{19}$ atoms/cm$^3$ to $5\times10^{19}$ atoms/cm$^3$ in the layer of amorphous silicon 34 results In this embodiment, the implantation energy should be between 15 and 40 keV. In this embodiment, an implantation energy of 15 keV is used. The nitrogen ions are to be implanted to a depth of 300 to 400 angstroms below the surface of layer of amorphous silicon 34.

Figure 4:
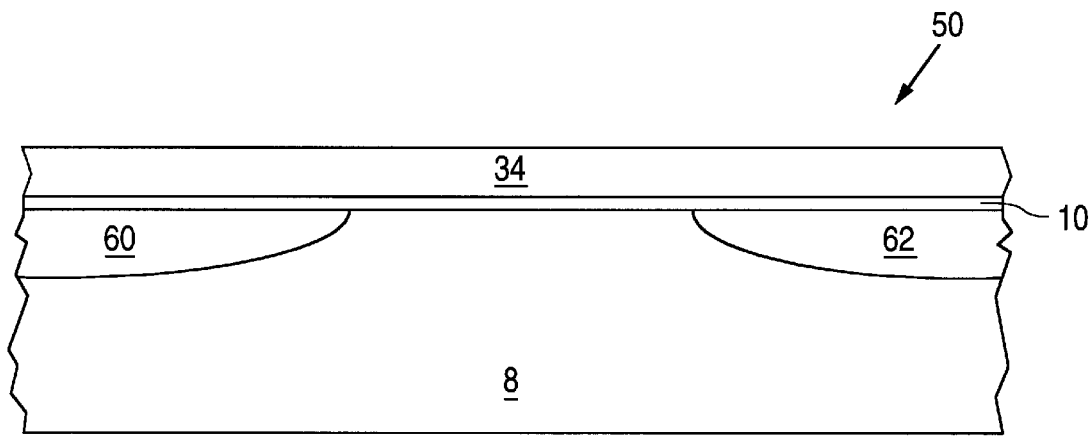
FIG. 4 depicts a cross sectional view of a structure 50 including a layer of amorphous silicon 34 that has been deposited.

Next, the resulting structure 50 of FIG. 4 is cleaned to remove contaminants from the surface of the implantation machine such as nitrogen ions. There are many methods to clean the structure. The structure may be dipped in a 5:1:1 water, hydrogen peroxide, and ammonia ($H_2O:H_2O_2:NH_4OH$) solution with a temperature of 60 degrees Celsius for 5 minutes and then rinsed conventionally. Alternatively, the structure may be dipped in a 6:1:1 water, hydrogen peroxide, and hydrogen chloride ($H_2O:H_2O_2:HCl$) solution with a temperature of 60 degrees Celsius for 5 minutes.

Alternatively, a layer of amorphous silicon 34 may be deposited over tunnel oxide layer 10 using a low pressure chemical vapor deposition (LPCVD) process. The LPCVD process involves directing a mixture of silane gas ($SiH_4$), a phosphene ($PH_3$) and helium gas mixture, and ammonia ($NH_3$) towards tunnel oxide layer 8 in an environment with a temperature between 510–530 degrees Celsius. The flow rates of silane gas and the phosphene-helium gas mixture are 2000 scam and 22 scam, respectively. In the phosphene and helium gas mixture, phosphene is provided at approximately one percent of the mixture. In this embodiment, the flow rate of ammonia is adjusted to achieve a desired doping level in the amorphous silicon between $1\times10^{19}$ atoms/cm$^3$ and $5\times10^{19}$ atoms/cm$^3$.

Figure 1:
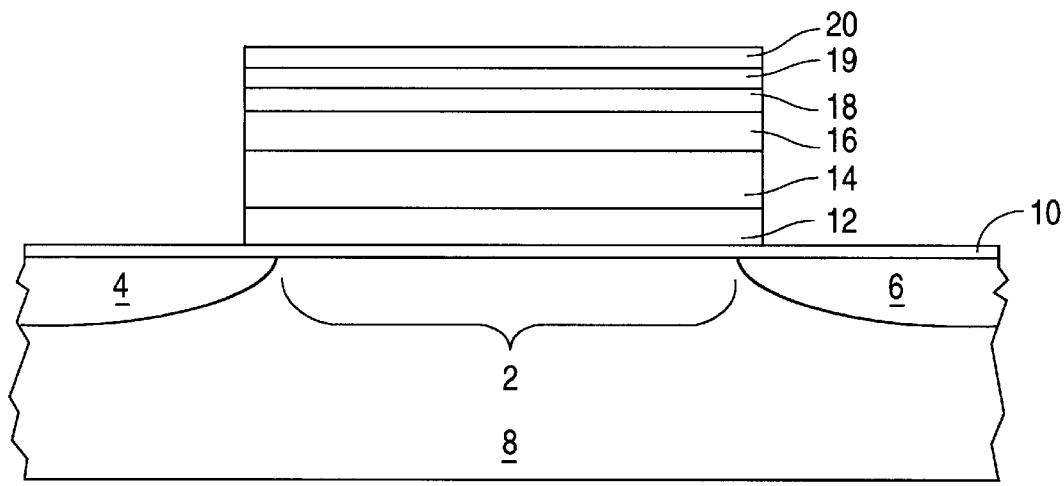
FIG. 1 depicts a cross section of a portion of a NOR-type memory device core cell.
Figure 2:
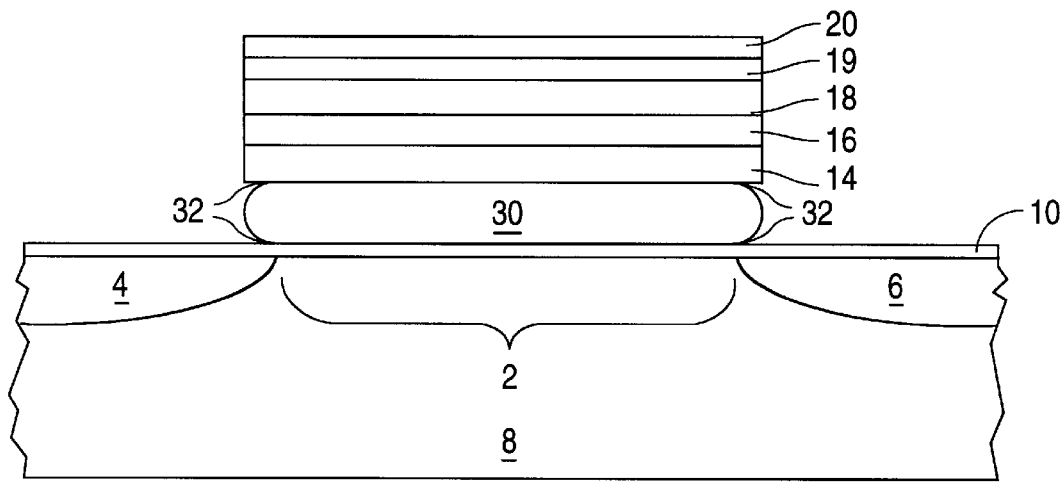
FIG. 2 depicts a cross sectional view of a portion of a NOR-type memory device core cell and an oxidized floating gate 30 and the rounding which occurs at positions 32.

Next, the amorphous silicon layer 34 is removed except for a region that is between desired source region 60 and desired drain region 62 and overlaps with desired source region 60 and desired drain region 62 by use of a conventional anisotropic dry etch technique. A suitable dry etch technique directs a mixture of $Cl_2$ and HBr gases with flow rates of 30 scam and 70 scam, respectively, at amorphous silicon layer 34 until etching of tunnel oxide layer 10 is detected. Tunnel oxide layer 10 thereby acts as the "stop layer". In this embodiment, the RF power of the etcher is set to 120 watts at a pressure of 125 millitorr. The resulting patterned amorphous silicon layer will correspond to floating gate 12 of FIG. 1 when it is subsequently annealed.

Figure 5:
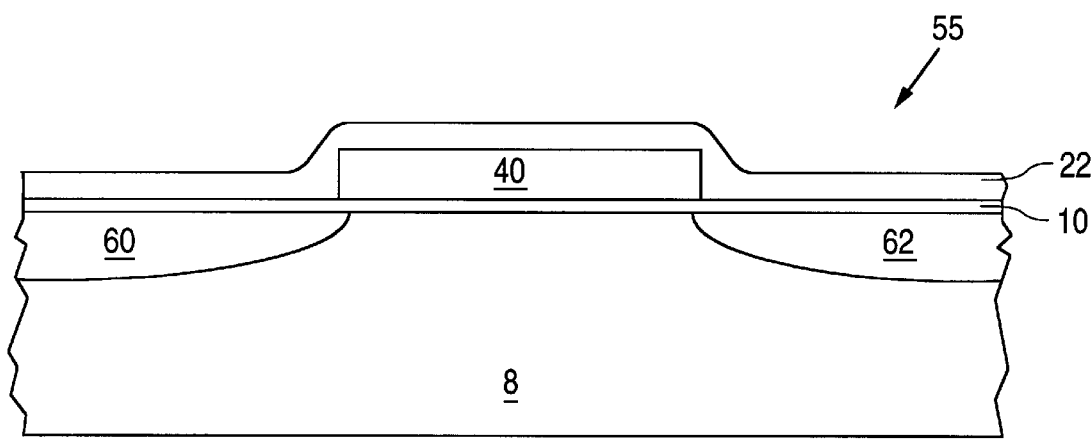
FIG. 5 depicts a cross sectional view of a structure 55 including a first oxide layer 22 and oxidation resistant polysilicon layer 40.

Next, a first oxide layer 22 is deposited over the resulting structure using a Low Pressure Chemical Vapor Deposition (LPCVD) process. In the LPCVD process, silane and $N_2O$ gases are directed towards the surface of the semiconductor substrate at flow rates of 20 scam and 1200 sccm, respectively. The resulting structure 55 of FIG. 5 is then heated to a temperature of 750 degrees Celsius in an environment with a pressure of 600 millitorr (hereinafter "first oxide heating step"). In this embodiment, the thickness of first oxide layer 22 is 50 angstroms.

The first oxide heating step also acts to transform the patterned amorphous silicon into oxidation resistant polysilicon layer 40 of FIG. 5 with a thickness, in this embodiment, of 700 angstroms. Heating the amorphous silicon in the process of forming the first oxide layer 22 rather than in the "alternative heating step" eliminates a thermo-cycle and the associated diminution of the polysilicon layer that will later become the floating gate.

The resulting oxidation resistant polysilicon layer 40 is provided with small and uniform grains and smooth top and bottom surfaces. The smooth top surface improves the reliability of the ONO 14 dielectric in a completed NOR-type memory device. The smooth bottom with fine uniform grains reduces variations in edge erase times among NOR-type memory devices.

Next, a middle nitride layer 14a (not separately shown in FIG. 6) is deposited using an LPCVD process. First, a mixture of dichloro-silane gas ($SiH_2Cl_2$) and ammonia gas ($NH_3$) are directed towards the structure with flow rates of 100 sccm and 600 sccm, respectively. The resulting structure is then heated to a temperature of 760 degrees Celsius. The middle nitride layer 14a is formed to a thickness of approximately 80 angstroms in this embodiment.

Next, an upper oxide layer 14b (not separately shown in FIG. 6) is formed using a wet thermal oxidation process. Firsts $O_2$ and $H_2$ are directed to the structure at flow rates of 5 L/min and 9 L/min, respectively. The resulting structure is then heated to 950 degrees Celsius. In this embodiment, approximately 20 to 25 angstroms of middle nitride layer 14a are oxidized to form a 40 to 50 angstroms thick upper oxide layer 14b. First oxide layer 22, middle nitride layer 14a, and upper oxide layer 14b together form an ONO 14 stack of FIG. 6, which is approximately 130 angstroms thick in this embodiment.

Next, a second layer of amorphous silicon 36 is deposited over ONO 14 stack using an LPCVD process. The LPCVD process involves directing a mixture of silane gas and a phosphene-helium gas-compound towards the structure with flow rates of 2000 sccm and 75 sccm, respectively, in an environment with a temperature of 530 degrees Celsius. In the phosphene-helium gas-compound, phosphene represents one percent of the mixture. In this embodiment, the desired doping level of the second layer of amorphous silicon 36 is $2\times10^{20}$ atoms/cm$^3$. The second layer of amorphous silicon corresponds to an intermediate form of a second layer of polysilicon (poly II layer) 16. In this embodiment, the thickness of poly II layer 16 is 1200 angstroms.

Next tungsten silicide ($WSi_x$) layer 18 is deposited conventionally over the device by a mixture of $WF_6$ and silane using an LPCVD process. The value of x varies from 2.1 to 2.6. In this embodiment, the thickness of the tungsten suicide layer 18 is 1500 angstroms.

Next, a polysilicon cap 19 is deposited conventionally over the tungsten silicide layer 18 by silane. In this embodiment, the thickness of the polysilicon cap 19 is 500 angstroms.

Next a silicon oxy-nitride (SiON) layer 20 is deposited conventionally over polysilicon cap 19 using a mixture of silane and $N_2O$ in a CVD process. In this embodiment, the thickness of SiON layer 20 is 1000 angstroms.

Figure 6:
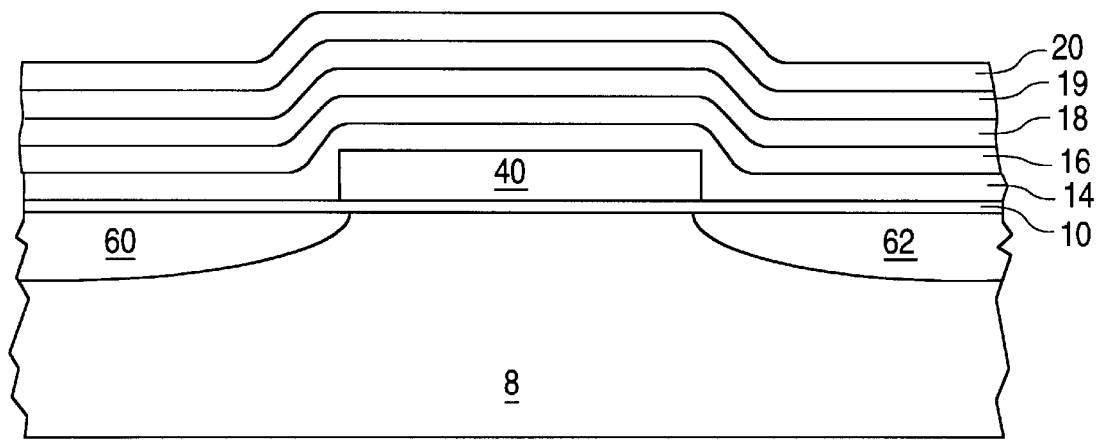
FIG. 6 depicts a cross sectional view of a portion of NOR-type memory device core cell including oxidation resistant polysilicon layer 40, ONO 14, poly II layer 16, tungsten silicide layer 18, polysilicon cap 19, and SiON layer 20.

The resulting structure with oxidation resistant polysilicon layer 40, ONO 14, poly II layer 16, tungsten silicide layer 18, polysilicon cap 19, and SiON layer 20 is shown in FIG. 6.

The processing steps remaining to complete a NOR-type memory cell ("remaining steps") include: etching SiON layer 20, polysilicon cap 19, tungsten silicide layer 18, poly II layer 16, and ONO 14 from above desired source region 60 and desired drain region 62; a DD implant in desired source region 60; an MDD implant in desired source region 60 and desired drain region 62; an MDD anneal; a spacer deposition and etch; an HTO deposition; a contact mask and etch; a contact implant; a metal deposition and etch; and nitride deposition. The remaining steps proceed in the conventional manner.

The foregoing description of the preferred embodiments of the invention has been presented for purposes of illustration and description. It is not intended to be exhaustive or to limit the invention to the precise form disclosed. Numerous modifications or variations are possible in light of the above teachings. The embodiments were chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are legally and equitably entitled.

What is claimed is:

1. A method of fabricating a semiconductor structure comprising:
    providing a first oxide layer over a substrate;
    providing a doped precursor layer of an oxidation resistant polysilicon layer over the first oxide layer; and
    providing a second oxide layer over the doped precursor layer, wherein the step of providing the second oxide layer further comprises heating the semiconductor structure to a temperature of approximately 750 degrees Celsius thereby to transform the doped precursor layer into an oxidation resistant polysilicon layer.

2. The method of claim 1 wherein the step of providing the oxidation resistant polysilicon layer further includes the step of:
    removing portions of the oxidation resistant polysilicon layer to thereby form a floating gate.

3. The method of claim 2 further uses a dry etch technique.

4. The method of claim 3 further uses a mixture of $Cl_2$ and HBr gases.

5. The method of claim 4 wherein the flow rate of the $Cl_2$ gas is approximately 30 sccm and the flow rate of HBr gas is approximately 70 sccm.

6. The method of claim 3 wherein etching stops when the first oxide layer is etched.

7. The method of claim 1 wherein the step of providing a second oxide layer uses a $SiH_4$ and $N_2O$ gas mixture.

8. The method of claim 7 wherein flow rates of $SiH_4$ and $N_2O$ are approximately 20 sccm and 1200 sccm, respectively.

9. The method of claim 7 further includes the step of heating the semiconductor device to approximately 750 degrees Celsius.

10. The method of claim 1, wherein the step of providing the doped precursor layer comprises the steps of:
    heating the semiconductor structure to a temperature of approximately 510 to 530 degrees Celsius; and
    applying a gas mixture over the first oxide layer to form an amorphous silicon layer, wherein the gas mixture comprises $SiH_4$ and a second gas mixture of $PH_3$ and He.

11. The method of claim 10 further comprising the step of:
    implanting nitrogen ions into the amorphous silicon layer to create a charged particle concentration in the the amorphous silicon layer between approximately $1\times10^{19}$ atoms/cm$^3$ to $5\times10^{19}$ atoms/cm$^3$.

12. The method of claim 11 further comprising the step of:
    removing contaminants from an exposed surface of the amorphous silicon layer.

13. The method of claim 1 wherein the step of providing the doped precursor layer of the oxidation resistant polysilicon layer further comprising the steps of:
    heating the semiconductor device to a temperature of approximately 510 to 530 degrees Celsius; and
    applying a gas mixture over the first oxide layer, wherein the gas mixture comprises $SiH_4$, a second gas mixture of $PH_3$ and He, and $NH_3$.

14. A method for fabricating a semiconductor device comprising:
    providing on a semiconductor substrate channel regions isolated from field oxide regions;
    providing a first oxide layer over the surface of said channel regions and field oxide regions;
    providing an oxidation resistant polysilicon layer over said first oxide layer; and
    providing a second oxide layer over said oxidation resistant polysilicon layer, wherein the step of providing the oxidation resistant polysilicon layer further includes the steps of:
        heating the semiconductor device to a temperature of approximately 510 to 530 degrees Celsius; and
        using a $SiH_4$, $PH_3$ and He mixture, and $NH_3$ gas mixture.

15. A method for fabricating a semiconductor device comprising:
    providing on a semiconductor substrate channel regions isolated from field oxide regions;
    providing a first oxide layer over the surface of said channel regions and field oxide regions;
    providing an oxidation resistant polysilicon layer over said first oxide layer; and
    providing a second oxide layer over said oxidation resistant polysilicon layer, wherein the step of providing the oxidation resistant polysilicon layer further include the steps of:
        heating the semiconductor device to a temperature of approximately 510 to 530 degrees Celsius; and
        using a $SiH_4$, $PH_3$ and He mixture, and $NH_3$ gas mixture, wherein the ratio of $PH_3$ to the $PH_3$ and He mixture is approximately 1:100.

16. A method for fabricating a semiconductor device comprising:
    providing on a semiconductor substrate channel regions isolated from field oxide regions;
    providing a first oxide layer over the surface of said channel regions and field oxide regions;
    providing an oxidation resistant polysilicon layer over said first oxide layer; and
    providing a second oxide layer over said oxidation resistant polysilicon layer, wherein the step of providing the oxidation resistant polysilicon layer further includes the steps of:
        heating the semiconductor device to a temperature of approximately 510 to 530 degrees Celsius; and
        using a $SiH_4$, $PH_3$ and He mixture, and $NH_3$ gas mixture, wherein the flow rates of $SiH_4$, and $PH_3$ and He mixture are approximately 2000 sccm and 22 sccm, respectively.

17. A method for fabricating a semiconductor device comprising:

providing on a semiconductor substrate channel regions isolated from field oxide regions;

providing a first oxide layer over the surface of said channel regions and field oxide regions;

providing an oxidation resistant polysilicon layer over said first oxide layer; and providing a second oxide layer over said oxidation resistant polysilicon layer, wherein the step of providing the oxidation resistant polysilicon layer further includes the steps of:

heating the semiconductor device to a temperature of approximately 510 to 530 degrees Celsius; and using a $SiH_4$, $PH_3$ and He mixture, and $NH_3$ gas mixture, wherein the doping level of the oxidation resistant polysilicon layer is approximately $1 \times 10^{19}$ atoms/cm$^3$ to $5 \times 10^{19}$ atoms/cm$^3$.

18. A method of fabricating a semiconductor structure further comprising the steps of:

forming a first oxide layer over a substrate;

forming a doped amorphous silicon layer over the first oxide layer;

removing portions of the amorphous silicon layer;

forming a second oxide layer over the amorphous silicon layer, wherein the step of forming the second oxide layer further comprises heating the semiconductor structure to a temperature of approximately 750 degrees celsius in a pressure of approximately 600 millitorr thereby to transform the doped amorphous silicon layer into polysilicon.

19. A method of fabricating a semiconductor structure further comprising the steps of:

forming a first oxide layer over a substrate;

forming an amorphous silicon layer over the first oxide layer;

removing portions of the amorphous silicon layer;

forming a second oxide layer over the amorphous silicon layer, wherein the step of forming the second oxide layer further comprises heating the semiconductor structure to a temperature of approximately 750 degrees celsius in a pressure of approximately 600 millitorr, wherein the step of forming an amorphous silicon layer further comprises the steps of:

heating the semiconductor structure to a temperature of approximately 510 to 530 degrees Celsius; and applying a gas mixture over the first oxide layer, wherein the gas mixture comprises a $SiH_4$ gas, a second gas mixture of $PH_3$ and He, and $NH_3$.

20. The method of claim 18 wherein the step of forming an amorphous silicon layer further comprising the step of:

heating the semiconductor structure to a temperature of approximately 510 to 530 degrees Celsius; and applying a gas mixture over the first oxide layer, wherein the gas mixture comprises a $SiH_4$ gas and a second gas mixture of $PH_3$ and He.

21. The method of claim 20 further comprising the step of:

implanting nitrogen ions into the amorphous silicon layer to achieve a concentration in the amorphous silicon layer of approximately $1 \times 10^{19}$ atoms/cm$^3$ to $5 \times 10^{19}$ atoms/cm$^3$.

22. The method of claim 21 further comprising the step of:

removing contaminants from a surface of the amorphous silicon layer.

* * * * *